(12) United States Patent
Crawford (10) Patent No.: US 7,417,464 B2
(45) Date of Patent: Aug. 26, 2008

(54) BI-DIRECTIONAL SIGNAL TRANSMISSION SYSTEM

(75) Inventor: John Crawford, Hendon (AU)

(73) Assignee: Integrated Electronic Solutions Pty. Ltd, Hendon, South Australia (AU)

( * ) Notice: Subject to any disclaimer, the term of this patent is extended or adjusted under 35 U.S.C. 154(b) by 0 days.

(21) Appl. No.: 11/856,009

(22) Filed: Sep. 14, 2007

(65) Prior Publication Data

US 2008/0074150 A1 Mar. 27, 2008

(30) Foreign Application Priority Data

Sep. 22, 2006 (AU) .............................. 2006905230

(51) Int. Cl.
*H03K 19/0175* (2006.01)

(52) U.S. Cl. .......................................... 326/89; 326/82

(58) Field of Classification Search .................... 326/21, 326/26, 27, 82, 89, 90
See application file for complete search history.

(56) References Cited

U.S. PATENT DOCUMENTS

| 5,467,455 | A | * | 11/1995 | Gay et al. | .................... | 710/100 |
| 6,014,040 | A | | 1/2000 | Tracy | | |
| 6,051,989 | A | * | 4/2000 | Walck | .......................... | 326/30 |

* cited by examiner

*Primary Examiner*—Don P Le
(74) *Attorney, Agent, or Firm*—David Aker (57) ABSTRACT

A bi-directional signal transmission system including, a first bi-directional signal path having circuitry adapted to generate a logic high level on said first path, one or more first stations connected to the first bi-directional signal path adapted to monitor a logic level on said first path, and to generate a logic low level on said first path, an interface device operatively coupled to the first bi-directional signal path, said interface device having a first receive input also capable of functioning as an output capable of pulling the first path low; and a second bi-directional signal path coupled to a transmit output and a receive input on the buffered side of the interface device, said interface device includes a first means for generating on the first bi-directional signal path a medium logic level in response to a low level on the receive input on the buffered side, and a second means for generating on the transmit output on the buffered side, a low logic level in response to a low level on the first bi-directional signal path, otherwise generating a high level on the said transmit output, wherein the one or more first stations are adapted to detect the medium and the low levels on the first bi-directional signal path as LOW, and the high logic level on the first bi-directional signal path as HIGH, and wherein further the first means for generating the medium logic level on the first signal path includes an open collector transistor, the emitter of which is connected to VEE, with its collector pulling the first signal path low through a diode connected transistor.

10 Claims, 7 Drawing Sheets

BI-DIRECTIONAL SIGNAL TRANSMISSION SYSTEM

TECHNICAL FIELD

This invention relates to a bi-directional signal transmission system for transmission of a binary signal in both directions. It further relates to improvements in providing a buffered interface in such a system.

BACKGROUND ART

A number of two wire bi-directional signal transmission systems have been extensively used. One such system is the Integrated Circuit Bus system (I2C Bus system), disclosed in the Philips Data Handbook IC12a, 1989, and "The I2C Bus and how to use it (including specifications)" 1995 Philips Semiconductors.

The I2C Bus system is a serial bus system between individual integrated circuits, or stations, that are interconnected through a bidirectional two wire transmission channel. Of the two wires, one carries a clock signal, and the other the data, with a predetermined communication protocol. Depending on the particular function within the system, an individual station can act as the transmitter, or as a receiver, or both.

The I2C system uses a data wire (SDA) and clock wire (SCL) which are connected to a positive supply ($V_{CC}$) through pull-up resistors. When the stations are not communicating the clock and data lines are free, and pulled high by these resistors. Each station which can communicate on the bus has an open collector or open drain output which can pull the bus lines to a low voltage level close to the negative supply ($V_{EE}$). The sequence in which the SCL and SDA lines are pulled low provides the communication information flow between the integrated circuits sharing that bus.

The number of stations allowed, or the distance over which the bus can communicate is determined by the load presented on the bus line by the total capacitance of each line. That is by the total of the capacitance of the bus wiring, the connections, the integrated circuit pins, and the capacitive load presented by each input/output circuit within the integrated circuit. If the bus capacitance is increased then the maximum possible speed of the bus is limited, and the slower rise times on the bus start to cause difficulties.

A number of design suggestions have been made to overcome the problems of expanding and extending the application of the I2C Bus beyond the limit presented by this capacitive load. Many simple circuits have been published seeking to provide this expanded capability. Most of these circuits have problems which may be associated with latching, be only conditionally stable, or present glitches. The usual limitation presented by such circuits is that they are unable to reverse their direction of signal flow when active, generating a glitch that can upset the bus I2C function. For example a circuit will latch if the receiving logic path goes low and transfers this input low to the output. If this low output is detected as being low and transmitted back along the return path, then this low signal returned to the input as a low will hold the input low, even when the original external low drive signal is removed. Thus the bus has 'latched' into this low state. To prevent latching, various circuit techniques have been suggested to break that loop, and yet to still fulfil the required function. Oscillation in such a loop becomes another possible problem.

A more subtle problem arises because the I2C Bus protocol has been defined so that two or more ICs are permitted to transmit (that is pull the I2C bus low) at the same time. All ICs connected to the bus monitor the bus line voltage, including the two or more which have started transmitting. As soon as one of those transmitting ICs detects that the bus has remained LOW although that IC is attempting to transmit a HIGH signal, then that IC will immediately cease transmitting. That is it stops transmitting as soon as it detects the LOW being transmitted by another IC while it was attempting to release the bus line to allow a high state. On detecting such a bus contention, it will stop transmitting and wait to retry at a later opportunity when hopefully there will be no contention.

Most of the circuits that have been suggested as providing a suitable buffering action have a problem that arises during this bus contention function. They fail to buffer the signals in a manner that does not generate spurious signals. To demonstrate this, consider when one side of the buffer circuit is held low, and while the input is still held low another integrated circuit connected to the buffer output generates a low signal. When the original input drive is released, the action of the buffer should be to detect the application of the low on the output side, and therefore the input should continue to hold the input bus low as the input drive ceases. However in all of the published circuits there is a delay between the time the active forward path switches off, and the reverse path is activated. This results in the input pin briefly being pulled high, generating a glitch which can be falsely interpreted by the integrated circuits connected on the input side as a signal pulse. Unfortunately many proposed circuits fail this glitch test, and allow the input to go high for the time needed for the buffer circuit to recognise that the direction of the signal path has reversed.

A solution to the problem of providing an effective buffer circuit is described in U.S. Pat. No. 6,014,040, Bi-Directional Signal Transmission System. In this circuit, which has been realised in the integrated circuit OM1896, the loop between the forward and the reverse buffered signal has been broken by adopting two voltage levels depending firstly on whether the bus is being held low below an input threshold Vref by a station on the I2C side of the buffer, that is on the first bidirectional signal path, an input below this reference voltage Vref therefore activates the forward signal path. The second voltage level Vtt is that generated by a low being transmitted by the reverse path in the buffer, this low being generated on the first bidirectional signal path as an output saturation voltage of the buffer. It is a slightly higher voltage than Vref and is still able to be interpreted by ICs (stations) connected on the input side as a bus low signal. It is therefore a low output signal generated by the reverse path on the first bi-directional signal path, and is a voltage level that is not as low as the threshold voltage of the forward path input comparator. In this way a buffer is created which neither latches, nor does it generate a glitch if the signal direction is reversed through the buffer by the inputs on both sides being held low sequentially, with the low signals overlapping in time.

On the buffered output bus side the OM1896 offers a split output and input path so that it can be interfaced to other ICs in which the transmit and receive paths are separated. For example, where it is necessary to provide optical isolation of the bus paths. If this capability is not needed then the bus out and bus receive pins may be wired together to give a single output connection to the buffer. On the side of the bus connected to the first bi-directional signal path and the I2C stations connected to this path, the difference between the input bus threshold used in the comparator sensing the voltage on that path, and the output saturation voltage generated when a low on the second bi-directional signal path is transmitted along the reverse path back to this input, allows the buffer to determine the direction in which the low signal is being transmitted without latching, and thereby avoids generating glitches when the signal path direction is reversed when the side of the buffer being held low is changed from one to the other side.

When the OM1896 was designed, these two voltage levels, that is Vref, and Vtt, were used to differentiate between a bus LOW signal being transmitted in the forward direction, with the input being held below the input threshold Vref, and a LOW signal output voltage in the reverse direction Vtt which is an output saturation voltage derived from the forward voltage across a diode junction. In a silicon bipolar integrated circuit this diode forward voltage drop is typically about 600 millivolts, and also has a negative temperature coefficient of typically two millivolts per degree Celsius. These typical voltages were acceptable for applications in which the majority of the integrated circuits used in the system were operating at 5 volts. Since then, increased integration, and an emphasis on designing for reduced power consumption, the typical power supply voltage of many I2C devices has fallen to as low as 2.5 volts.

It is an object of the present invention to provide a bi-directional signal transmission system that overcomes or at least substantially ameliorates the problems associated with the prior art.

It is a further object of this invention to overcome the limitations inherent in the design of prior art bi-directional transmission systems to better match the characteristics to those of the integrated circuits, or stations, with which such systems are to be used.

SUMMARY OF THE INVENTION

A bi-directional bus buffer including means to buffer clock and timing signals. The clock and data signal paths each include a buffer circuit adapted to allow the extension of such a communication bus to cover more stations or to operate over an increased distance.

Accordingly there is provided a bi-directional signal transmission system comprising; a first bi-directional signal path including circuitry adapted to generate a logic high level on said first path, one or more first stations connected to the first bi-directional signal path adapted to monitor a logic level on said first path, and to generate a logic low level on said first path; an interface device operatively coupled to the first bi-directional signal path, said interface device having a first receive input also capable of functioning as an output capable of pulling the first path low; and a second bi-directional signal path coupled to a transmit output and a receive input on the buffered side of the interface device.

Preferably, the interface device includes first means for generating on the first bi-directional signal path a medium logic level in response to a low level on the receive input on the buffered side, and second means for generating on the transmit output on the buffered side, a low logic level in response to a low level on the first bi-directional signal path, otherwise generating a high level on the said transmit output, wherein the one or more first stations are adapted to detect the medium and the low levels on the first bi-directional signal path as LOW, and the high logic level on the first bi-directional signal path as HIGH.

The design of this invention includes circuitry to enable the medium and the low levels to be designed to provide optimum values of the input threshold voltage and the output saturation voltage at the input that are most appropriate to be interfaced to typical bus stations. These two voltages are designed to present the optimum voltages over the full operating temperature range specified for integrated circuits in typical applications of this kind.

In a preferred embodiment of this invention the first means for generating the medium logic level on the first signal path includes an open collector transistor, the emitter of which is connected to VEE, with its collector pulling the first signal path low through a diode connected transistor. The diode connected transistor has a resistor connected between its collector and base, with a current source from VCC driving the junction of the resistor and base. The emitter of the diode connected transistor is connected to the collector of the open collector transistor and the collector is connected to the first signal path.

The first signal path is pulled low to a voltage made up of the sum of the saturation voltage of the open collector transistor with the forward diode voltage drop of the diode connected transistor decreased by the voltage drop generated by the current source current flowing in the resistor connected between collector and base.

In a further preferred embodiment of this invention the second means has a comparator, one input of which is connected through a resistor to the junction of the current source and the base of the diode connected transistor. The other input is connected to a reference voltage which is generated from the voltage drop across a diode junction driven by a current source, offset by the small voltage drop generated by a further current source generating a voltage across a fixed resistor.

Another embodiment has a bi-directional signal transmission system including; a first bi-directional signal path capable of generating thereon a high logic level, with one or more first stations connected to the first bi-directional signal path each capable of generating on the first bi-directional signal path a logic low level, and a second bi-directional signal path, wherein one or more first stations are adapted to detect a medium logic level and low logic level as LOW and the high logic level on the first bi-directional signal path as HIGH, the interface device adapted to be coupled to the first bi-directional signal path and having a receive input and a transmit output adapted to be coupled to the second bi-directional signal path, wherein the interface device includes first means for generating on the first bi-directional signal path a said medium logic level in response to a low logic level on the receive input, and second means for generating the transmit output at low logic level in response to said low logic level on the first bi-directional signal path, otherwise generating a high logic level in the said transmit output.

The means for generating these signal logic levels in the interface device are designed to ensure that over the range of temperatures at which the interface device is to be used the circuit generating these logic levels is designed to exhibit minimal variation.

A further aspect of this invention is that the preferred embodiment uses current sources exhibiting temperature characteristics that offer a buffer circuit in which the input threshold voltage, and the output saturation voltage of the reverse signal path are independent of temperature. It is evident that by using different characteristics for the current sources, and varying the proportion by which these voltages depend on those current sources, then they may be varied to show other desirable characteristics such as a temperature dependence that matches the temperature characteristics of the stations connect to the bus line. This variation can be applied to each of these voltages to create the most preferred characteristic in each of them.

BRIEF DESCRIPTION OF THE DRAWINGS

The invention will be explained in further detail by way of example and explanation of some of the different possibilities in its application and its design with reference to the accompanying drawings.

DESCRIPTION OF THE PREFERRED EMBODIMENT

Figure 1:
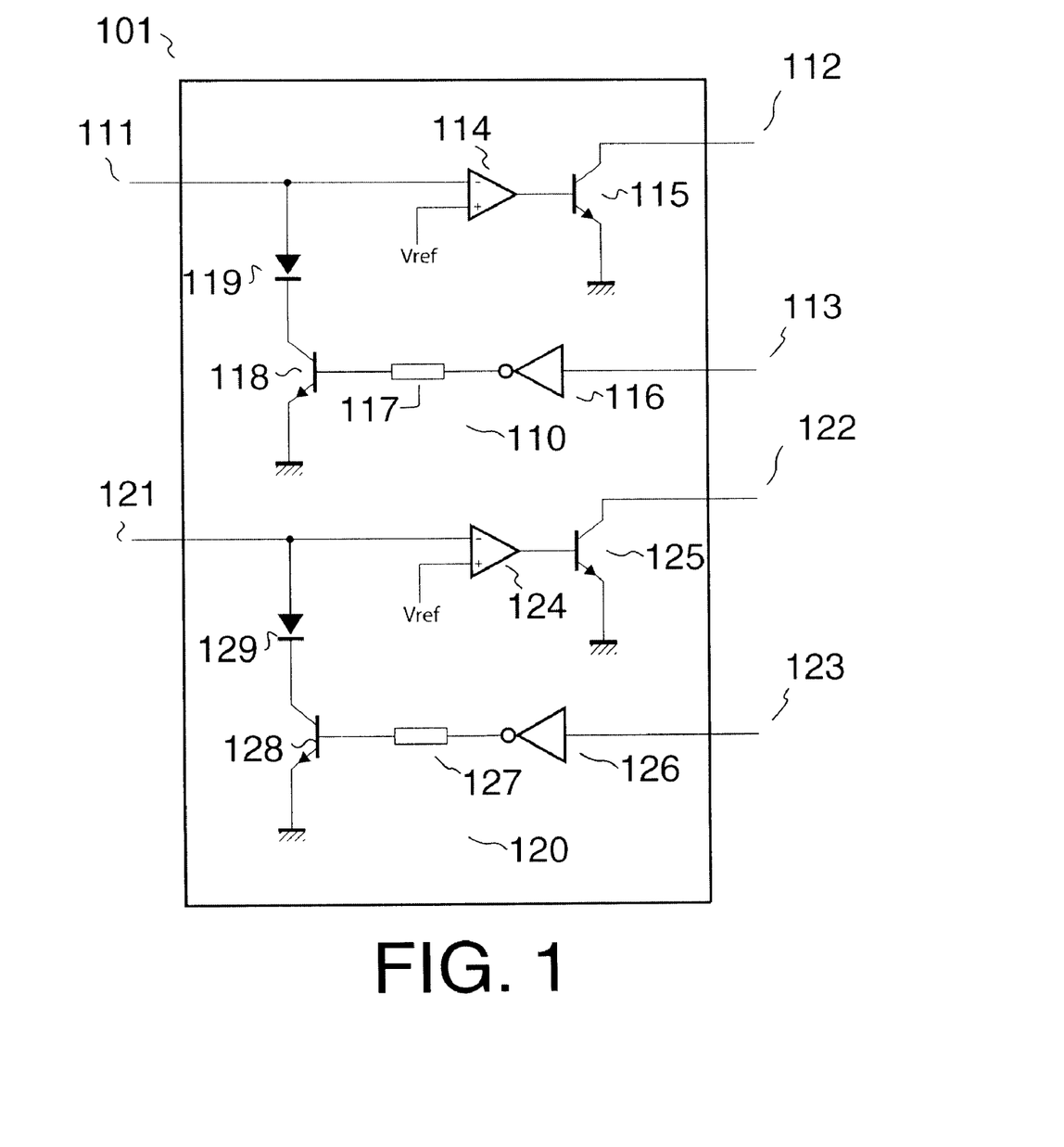
FIG. 1 shows the basic structure of a buffer of the prior art, in this case the OM1896 as described in U.S. Pat. No. 6,014,040.

FIG. 1 shows the structure of the OM1896 buffer as described in U.S. Pat. No. 6,014,040. In this circuit the OM1896 integrated circuit 101 contains two identical buffers. The input connected to the first bi-directional signal path 111 is normally pulled high by the pull-up mechanism on that signal path. When it is high the input voltage is more positive than the reference voltage Vref on the comparator 114. This puts a low level on the base of transistor 115, and the output connected to the second bi-directional signal path 112 is able to be pulled high by the pull-up mechanism on that path.

With temperature the medium reference voltage Vref is designed to follow the low voltage generated by a low logic signal on the reverse input 113, and in the OM1896 is normally made up of a transistor circuit based on a single transistor emitter base voltage reduced by an offset voltage component generated by the voltage drop derived from the voltage across an integrated resistor carrying a constant current.

As is described in U.S. Pat. No. 6,014,040 the open collector transistor 115 pulling the output 112 low can be connected to the reverse path input 113 either internally within the integrated circuit making up the buffer or externally as shown. In the OM1896 these two connections 112 and 113 are each made available externally to the integrated circuit as shown in FIG. 1, and if preferred may be connected together externally. By having both connections available opto-couplers can be used to isolate the circuitry of the buffer from the bus lines connected to remote circuits as is also described in U.S. Pat. No. 6,014,040.

In the reverse path, the input 113 also connected to the second bi-directional signal path drives the transistor 118 via an inverting buffer 116, and base drive limiting resistor 117. When this input signal 113 is high, the base drive to transistor 118 is off, and the transistor is off.

When the input 113 goes low, the transistor 118 is turned on, pulling its collector low, and through diode 119, serving to pull the input/output on the first bi-directional path down to a voltage Vtt as is described in U.S. Pat. No. 6,014,040. In the OM1896 this voltage is typically 640 mV with a 3 mA bus pull-up current. As is evident from this circuit 101, which describes this part of the OM1896 circuit, the voltage Vtt is substantially made up of the voltage drop across a forward biased diode, and is therefore temperature sensitive, exhibiting a negative temperature coefficient of about −2 mV per degree Celsius.

It is this temperature sensitivity that in the OM1896 needs to be matched by a similar coefficient of temperature sensitivity for the voltage Vref, which is set to be a safe margin below the reverse path pull-down voltage Vtt. This gap is typically 240 mV.

Figure 2:
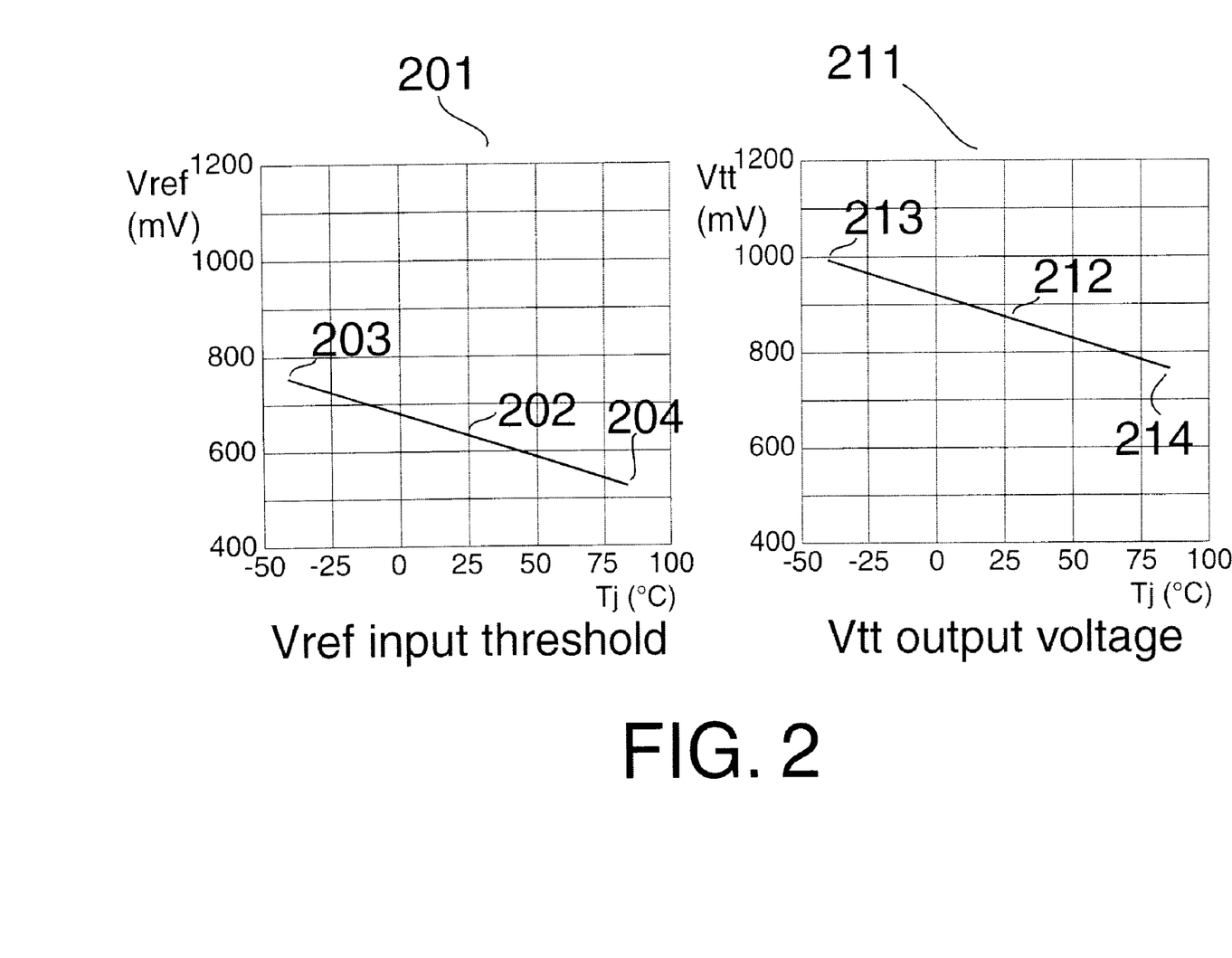
FIG. 2 shows graphs of the temperature dependence of the input reference threshold voltage Vref and the output saturation voltage Vtt on the first bi-directional signal path over the operating junction temperature range for the OM1896 buffer.

This temperature dependence is shown in FIG. 2. In the graph 201 the typical Vref threshold is plotted against junction temperature over the range of −40 to +85 degrees Celsius. As can be seen, at 25 degrees the typical Vref voltage 202 is 640 mV, and when cold at −40 degrees this threshold voltage 203 increases to 750 mV. At high temperature, 85 degrees, the threshold voltage 204 falls to 530 mV. This is a reference voltage generated in the comparator input of the buffer, and has been designed to track the reverse path low signal voltage Vtt over the temperature range.

In the second graph 211 in FIG. 2, the output saturation voltage Vtt is shown. This is the voltage generated by the reverse signal transmitted through the buffer when the second bi-directional bus is low, the transistor 118 in FIG. 1 is on, and is acting to pull the first bi-directional path low, carrying a pull down current of 3 mA and with none of the stations connected to this first bi-directional path switched on.

As can be seen the typical voltage that the first bi-directional path is pulled down to for a 3 mA load current is typically 880 mV at 25 degrees Celsius 212, 990 mV at −40 degrees 213, and 760 mV at 85 degrees 214.

While the voltage variation with temperature was acceptable with typical logic levels associated with logic circuits operating on a 5 volt supply, at lower supply voltages the level at the cold point of nearly 1 volt is too close to the low input threshold of some of the lower voltage integrated circuit stations that might be used.

Figure 3:
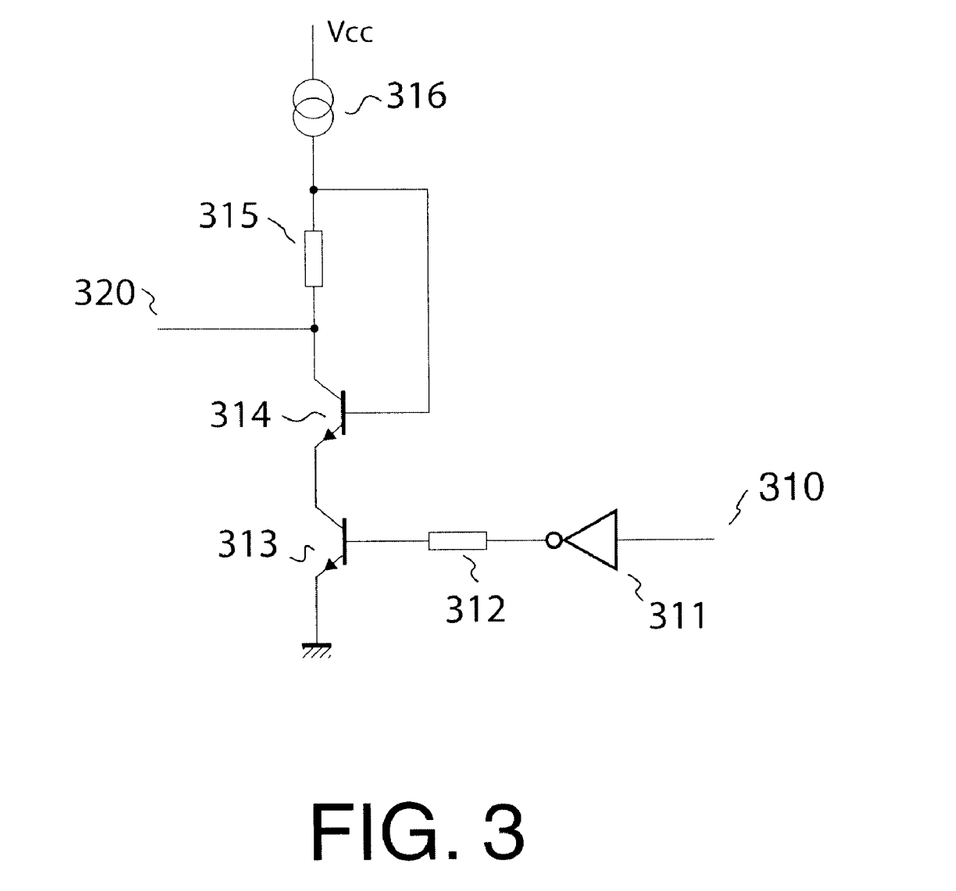
FIG. 3 shows an exemplary circuit for the signal path from the buffered side of the bi-directional bus back to the input side for a buffer of the current invention, that is from the second bi-directional signal path back to the first bi-directional signal path.

FIG. 3 shows the circuit utilising improvements of this invention to provide a temperature compensated reverse path low output saturation voltage Vtt on its output 320 which is connected to the first bi-directional signal path.

When a low voltage is presented on the second bi-directional signal path input 310 an inverting buffer 311 provides base drive to the transistor 313 turning it on.

The key to the temperature compensation is the circuit combining a diode connected transistor 314, with the added feature of a resistor 315 from the base connection to the collector and output 320 connected to the first bi-directional signal path. The key to its operation lies in the temperature sensitive current source 316 which by flowing through resistor 315 provides a compensating voltage to correct the normal negative temperature coefficient of the silicon junction diode which is the forward biased emitter base junction of the transistor 314.

In one realisation of this invention the resistor 315 has a resistance of about 315 ohms, and the current source 316 is near zero at the maximum temperature of 85 degrees Celsius, when the temperature dependant emitter base diode voltage is at its lowest. The current generated by the current source is designed so that its output increases linearly with decreasing temperature to a value approaching 1 mA at the lowest operating junction temperature. The voltage drop across the resistor 315 will increase as the circuit is cooled ensuring that the voltage seen on the first bi-directional signal path remains nearly constant as the reduction in temperature increases the emitter base voltage of the transistor 314 with the voltage generated by the current in resistor 315 offsetting that increase.

With judicious design the voltage across the resistor can compensate for the diode junction temperature sensitivity, giving an output that no longer demonstrates the major temperature sensitivity exhibited in the earlier design.

Figure 4:
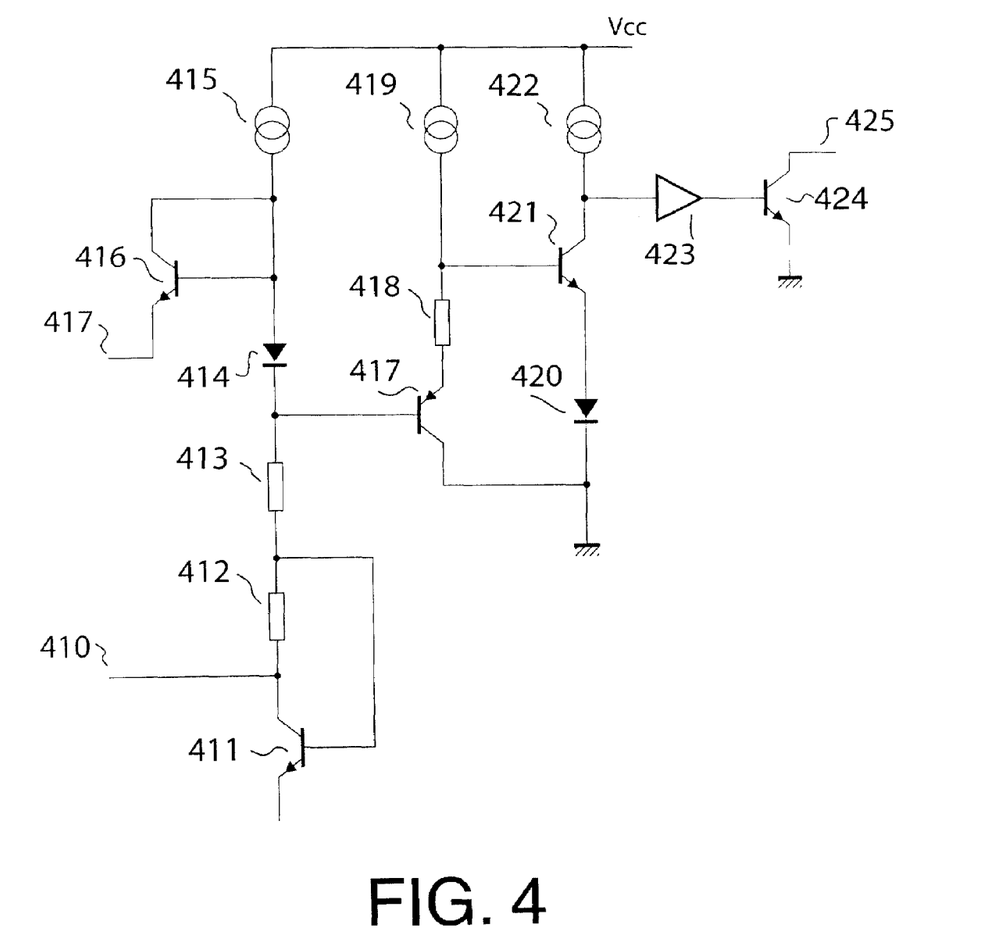
FIG. 4 shows an exemplary circuit for the forward path for a buffer of the current invention, that is the path from the input from the first bi-directional signal path through to the second bi-directional signal path.

The compensated circuit for the forward path comparator with the Vref threshold is shown in FIG. 4. In this circuit one or more of the stations connected to the first bi-directional signal path 410 is pulling this path low. That is below the voltage generated on this output 410 by the reverse path through the buffer being active low. Even if this reverse path is seeking to generate a low on the first bi-directional signal path, the diode connected transistor 411 is held off by one or more active stations connected on the first bi-directional signal path seeking to pull it low, and therefore allowing insufficient voltage to be present on the base of transistor 411 for it to carry sufficient current to upset the operation of the Vref threshold comparator.

With the diode connected transistor 411 cut off then the threshold detection circuit at the connection 410 to the first bi-directional signal path is made up first by the voltage offset generated by the resistors 412 and 413 in series carrying the current provided by the temperature compensated current source 415 applied to the comparator input presented by the base connection to transistor 417.

A further refinement of the circuit (not shown in the part of the circuit described in FIG. 3) is the addition of a diode 414 in series with the current source drive 415, together with the addition of a diode connected catching transistor 416 connected to a reference voltage 417. When the first bi-directional path 410 is released, and no stations or buffer action is pulling it low, then instead of the current source flowing into this path when it is pulled high, the catching transistor conducts, and prevents the temperature compensated current source 415 output from continuing to pull that first bi-directional signal path high.

The voltage comparator circuit comprises transistors 417, 421 and diode connected transistor (shown as a diode), 420, with two constant current sources 419 and 422. In this circuit the size of PNP transistor 417 is related to the geometrically similar diode connected PNP transistor 420 so that the current density in each of these transistors is equal so that the temperature sensitivity of the forward biased base emitter voltage of these two PNP transistors cancel over the full temperature range.

The current source 419 generates an offset voltage in resistor 418 which serves to reduce the input threshold by a fixed amount before applying the total voltage to the base of transistor 421. With a falling voltage on the first bi-directional signal path connected to input 410, this voltage is increased by the temperature compensating voltage dropped across resistors 412 and 413, together with the voltage generated by the current source 419 flowing in resistor 418. This voltage is applied to the base of transistor 421, the forward voltage drop of which provides a threshold with a similar temperature coefficient to the diode connected transistor 314 in FIG. 3. The falling voltage on the first bi-directional signal path will start to cut off transistor 421 as it approaches the Vref threshold. When the collector current of transistor 421 falls sufficiently to no longer pull down its collector against the current source 422, the buffer 423 switches, turning on output transistor 424, and pulling the output of the buffer 425 low. This output is connected to the second bi-directional signal path.

As the resistor 412 is part of the compensation circuit for the temperature dependence of the reverse signal path, additional resistance 413 is added to ensure that slightly more temperature compensation is applied equally to the forward Vref path so that both the reverse and the forward signal paths in the buffer are equally compensated. That is that both Vtt and Vref exhibit similar temperature sensitivity. The voltage drop of resistor 418 can then be chosen to provide the required margin between these two voltages for optimum performance of the buffer, balancing functionality, with a sufficient voltage difference between the two thresholds to give adequate noise immunity as well as performance.

In one example of this invention in which resistor 412 has a resistance of 315 ohms, resistor 413 is 50 ohms, and the sum of these provides the temperature part of the compensation setting Vref. With current source 419 providing 100 microamps and resistor 418 having a resistance of 1700 ohms, the uncompensated level of Vref is set. Current source 422 is 50 microamps, and to provide a balanced temperature performance in this example, the geometry of transistor 417 is double that of diode connected transistor 420 to offer the same current density at the switching threshold.

Figure 5:
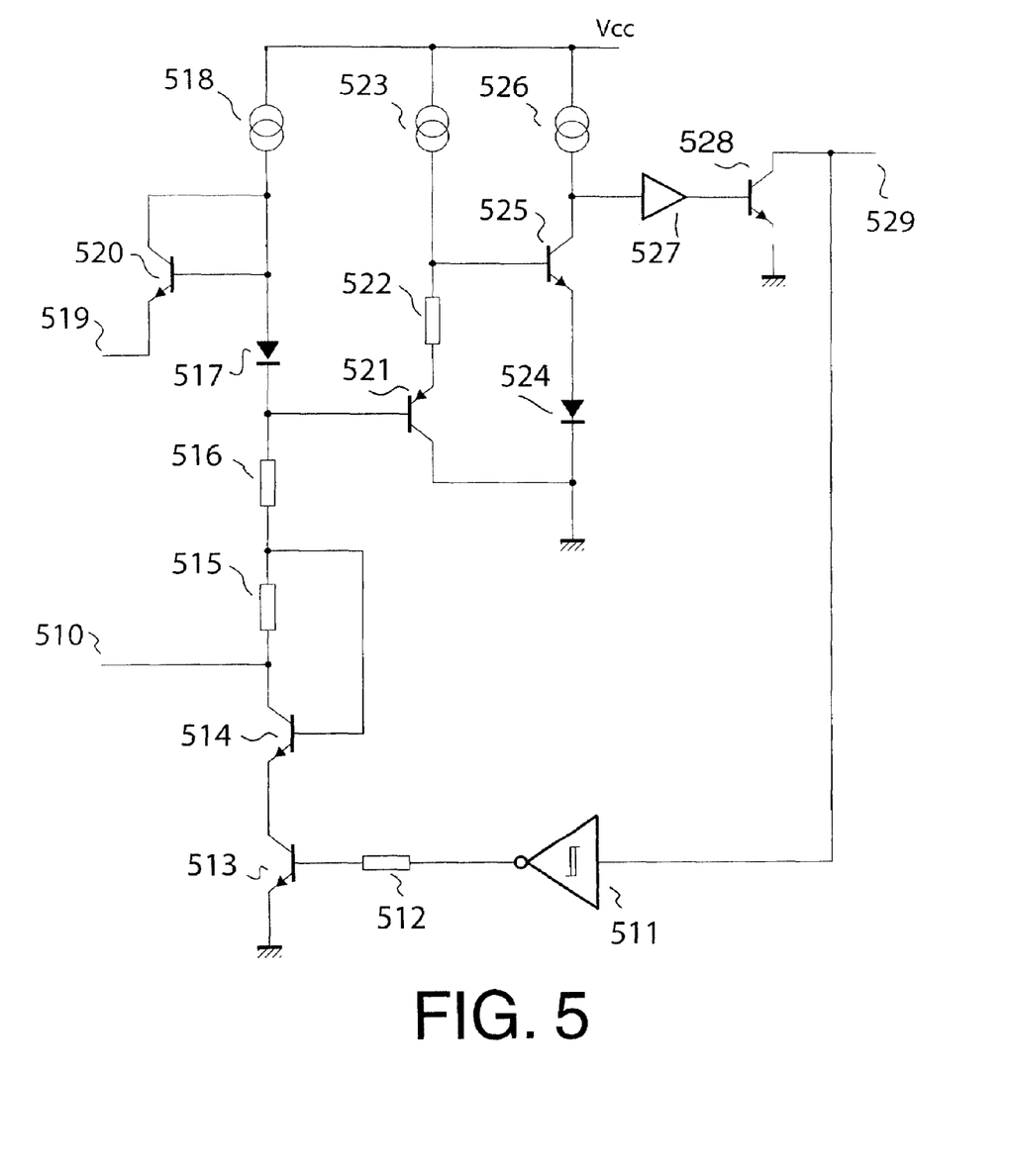
FIG. 5 shows an embodiment of the complete circuit for a buffer of the current invention, combining the elements shown in FIG. 2 and FIG. 3.

FIG. 5 combines the circuits of FIGS. 3 and 4 showing both the forward and reverse signal paths through the buffer from the first bi-directional signal path to the second bi-directional signal path.

In FIG. 5 the full path of the compensating current flow from current source 518 is evident. It flows through the diode 517, through resistors 516 and 515, and either out via the connection to the first bi-directional signal path 510, or via diode connected transistor 514, and output drive transistor 513.

Note that when one of the stations connected to the first bi-directional signal path 510 is active, and pulling input 510 low, this temperature compensating current becomes part of the total pull down current seen by that station. This additional pull down load must be taken into account when carrying out the application design to ensure that the pull down capability is not exceeded.

The other point of note in FIG. 5 is that on the second bi-directional signal path side the output and inputs are shown as a common connection 529. This is the optional alternative connection, depending on whether the pin count permits them to be connected externally outside the integrated circuit package for the buffer, or they may be internally joined and brought out to a single connection as shown in FIG. 5.

Figure 6:
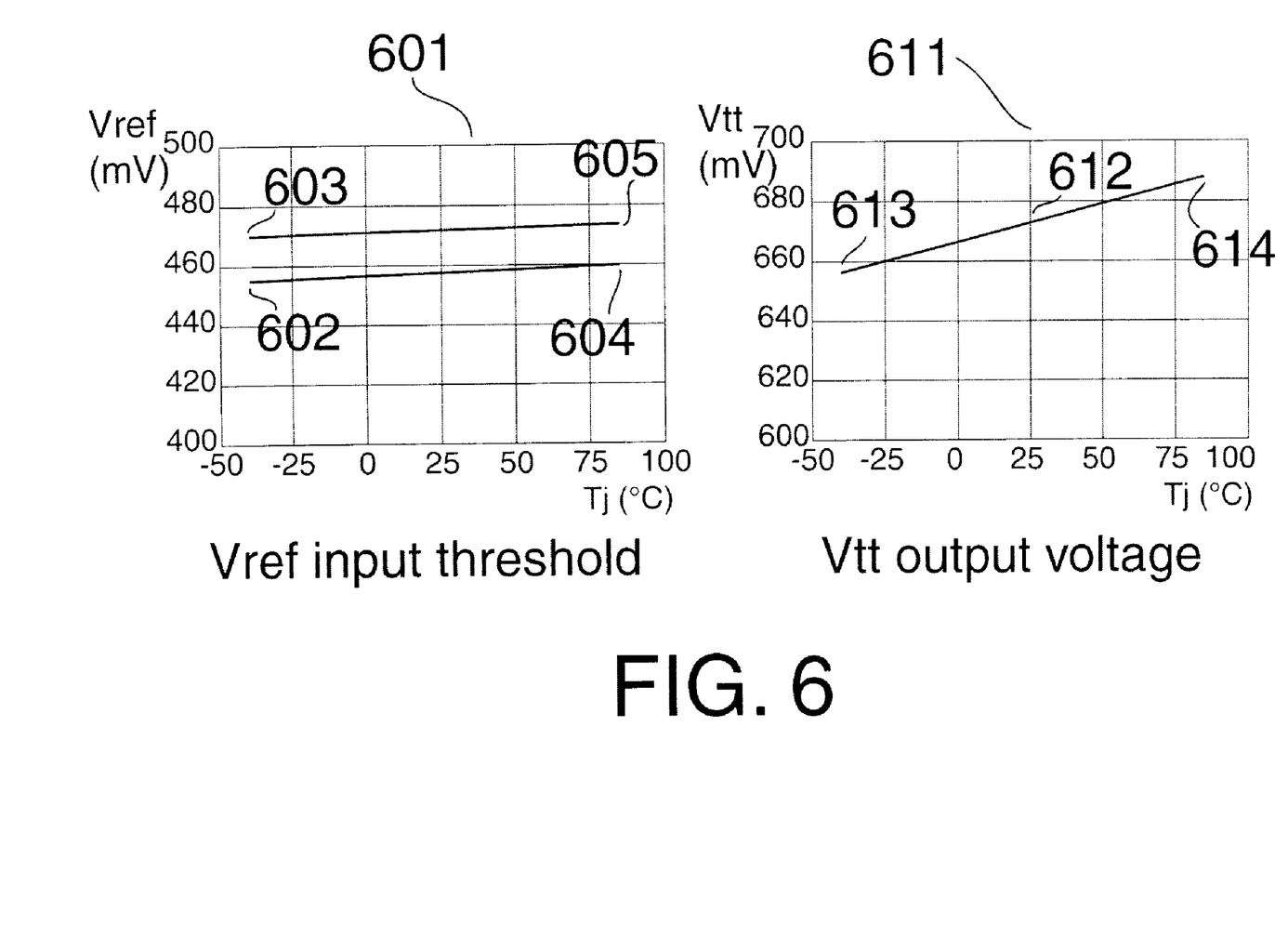
FIG. 6 shows graphs for a buffer using the circuit described in this invention exhibiting the very much reduced temperature dependence of the input reference threshold voltage Vref and the output saturation voltage Vtt on the input/output connected to the first bi-directional signal path over the operating junction temperature range. Furthermore it allows a designer to set the input threshold voltage, and the reverse path output saturation voltage level to the required optimum voltages for this application.

In FIG. 6 graphs of the input reference threshold voltage and the output saturation voltage against temperature show the variation of the Vref and Vtt voltages against temperature for the circuit used in this invention. As can be seen in graph 601, there are two characteristic lines, one 602 to 604 showing the typical value of Vref against temperature for a supply voltage of 2.7 volts, and the other 603 to 605 showing the values for a supply voltage VCC of 15 volts. When compared with the corresponding graph of FIG. 2, and noting the greatly expanded scale of the voltage Vref, it is evident that there has been a great improvement in the stability against temperature of this reference voltage.

Graph 611 shows a similar improvement in the reduction of the variation of the reverse path output voltage Vtt. This characteristic 612, varies from a typical figure of 656 millivolts 613 at −40 degrees Celsius, to 688 millivolts at 85 degrees junction temperature 614.

Figure 7:
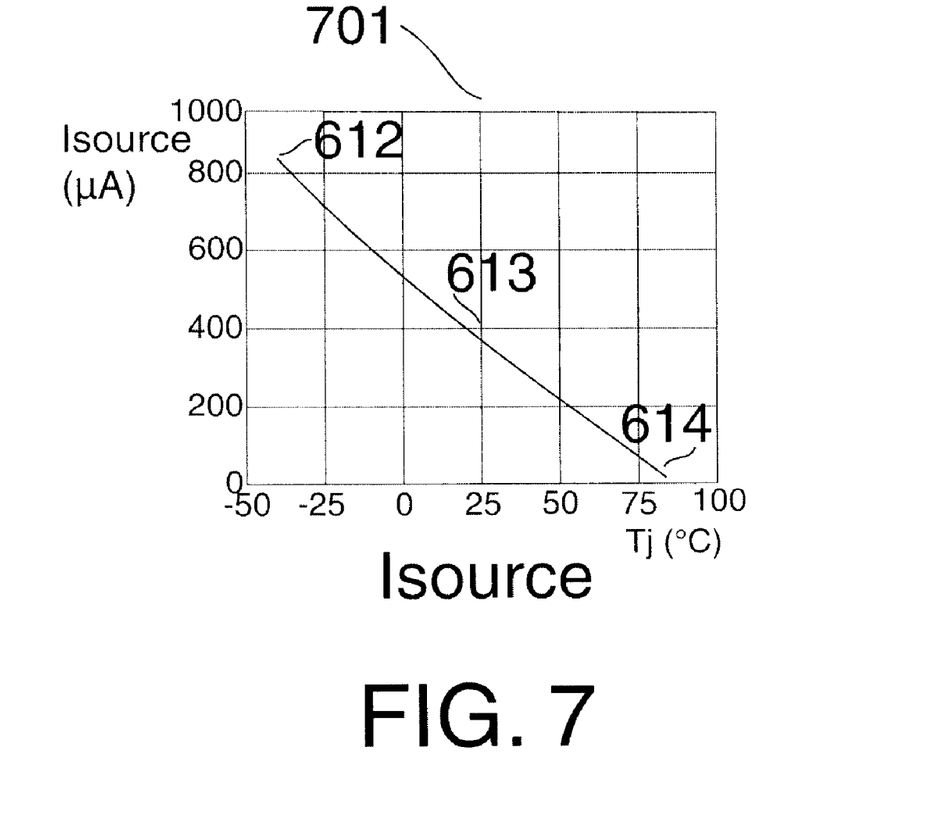
FIG. 7 shows a graph of the temperature dependence of the current source used in the circuit described in this invention by which this temperature dependent current is used to compensate for the variation in the input reference threshold voltage Vref and the output saturation voltage Vtt voltage that are observed over the temperature range without this compensation.

FIG. 7 shows the current dependence against temperature for the temperature dependant current source that is used to generate the temperature compensating voltages.

It is of interest to note that at high temperatures the current from this temperature dependent current source can fall to zero. At higher temperatures than this, there is no compensating voltage drop generated in the compensation resistors, and although the threshold voltages are no longer compensated for further increases in temperature, operation is unaffected and can be acceptable although it is operating at a temperature above the compensation range.

The design target voltages have been chosen to set the Vref level at a small margin above the 400 millivolt level which is taken as the guaranteed low output of a typical active station on the signal path pulling it low. Similarly, the voltage of the reverse path output saturation voltage Vtt is designed to be some 200 millivolts above this input reference threshold Vref, and to be well below the upper limit which the input to a station records as a low voltage on the bus. These typical values should be maintained over the full range of temperatures, as well as for different supply voltages.

As can be seen from the results shown in FIG. 6, this invention has the advantage of giving a considerable improvement in the performance of the buffer when compared to the earlier design.

Although the invention has been herein shown and described in what is conceived to be the most practical and preferred embodiment, it is recognised that departures can be made within the scope of the invention, which is not to be limited to the details described herein but is to be accorded the full scope of the appended claims so as to embrace any and all equivalent devices and apparatus.

What is claimed is:

1. A bi-directional signal transmission system including; a first bi-directional signal path having circuitry adapted to generate a logic high level on said first path, one or more first stations connected to the first bi-directional signal path adapted to monitor a logic level on said first path, and to generate a logic low level on said first path; an interface device operatively coupled to the first bi-directional signal path, said interface device having a first receive input also capable of functioning as an output capable of pulling the first path low; and a second bi-directional signal path coupled to a transmit output and a receive input on the buffered side of the interface device, said interface device includes a first means for generating on the first bi-directional signal path a medium logic level in response to a low level on the receive input on the buffered side, and a second means for generating on the transmit output on the buffered side, a low logic level in response to a low level on the first bi-directional signal path, otherwise generating a high level on the said transmit output, wherein the one or more first stations are adapted to detect the medium and the low levels on the first bi-directional signal path as LOW, and the high logic level on the first bi-directional signal path as HIGH, and wherein further the first means for generating the medium logic level on the first signal path includes an open collector transistor, the emitter of which is connected to VEE, with its collector pulling the first signal path low through a diode connected transistor.

2. The bi-directional signal transmission system of claim 1 wherein the diode connected transistor has a resistor connected between the collector and base, with a current source from VCC driving the junction of the resistor and base.

3. The bi-directional signal transmission system of claim 2 wherein the emitter of the diode connected transistor is connected to the collector of the open collector transistor, and the collector is connected to the first signal path.

4. The bi-directional signal transmission system of claim 3 wherein the first signal path is pulled low to a voltage made up of the sum of the saturation voltage of the open collector transistor with the forward diode voltage drop of the diode connected transistor decreased by the voltage drop generated by the current source current flowing in the resistor connected between collector and base.

5. The bi-directional signal transmission system of claim 4 wherein the second means has a comparator.

6. The bi-directional signal transmission system of claim 5 wherein a first comparator input is connected through a resistor to the junction of the current source and the base of the diode connected transistor.

7. The bi-directional signal transmission system of claim 5 wherein a second comparator input is connected to a reference voltage which is generated from the voltage drop across a diode junction driven by a current source, offset by the small voltage drop generated by a further current source generating a voltage across a fixed resistor.

8. A bi-directional signal transmission system of claim 7 wherein current sources exhibit temperature characteristics that offer a buffer circuit in which the input threshold voltage, and the output saturation voltage of the reverse signal path are independent of temperature such that by using different characteristics for the current sources, and varying the proportion by which these voltages depend on those current sources, then the voltages may be varied to show other desirable characteristics such as a temperature dependence that matches the temperature characteristics of the stations connected, allowing these variation to be applied to each of these voltages to provide the optimum characteristic for each.

9. A bi-directional signal transmission system including; a first bi-directional signal path capable of generating thereon a high logic level, with one or more first stations connected to the first bi-directional signal path each capable of generating on the first bi-directional signal path a logic low level, and a second bi-directional signal path, wherein one or more first stations are adapted to detect a medium logic level and low logic level as LOW and the high logic level on the first bi-directional signal path as HIGH, the interface device adapted to be coupled to the first bi-directional signal path and having a receive input and a transmit output adapted to be coupled to the second bi-directional signal path, wherein the interface device includes first means for generating on the first bi-directional signal path a said medium logic level in response to a low logic level on the receive input, and second means for generating the transmit output at low logic level in response to said low logic level on the first bi-directional signal path, otherwise generating a high logic level in the said transmit output wherein means for generating these signal logic levels in the interface device are designed to ensure that over the range of temperatures at which the interface device is to be used the circuit generating these logic levels is designed to exhibit minimal variation.

10. A bi-directional signal transmission system of claim 9 wherein current sources exhibit temperature characteristics that offer a buffer circuit in which the input threshold voltage, and the output saturation voltage of the reverse signal path are independent of temperature such that by using different characteristics for the current sources, and varying the proportion by which these voltages depend on those current sources, then the voltages may be varied to show other desirable characteristics such as a temperature dependence that matches the temperature characteristics of the stations connected, allowing these variation to be applied to each of these voltages to provide the optimum characteristic for each.

* * * * *

UNITED STATES PATENT AND TRADEMARK OFFICE
CERTIFICATE OF CORRECTION

PATENT NO. : 7,417,464 B2  
APPLICATION NO. : 11/856009  
DATED : August 26, 2008  
INVENTOR(S) : John Crawford et al.

Page 1 of 1

It is certified that error appears in the above-identified patent and that said Letters Patent is hereby corrected as shown below:

Title Page, Item (12) delete "Crawford" and insert -- Crawford et al. --.

Title Page, Item (75) Inventor:

should read

-- (75) Inventors: John Crawford, Hendon (AU); Malcolm Kay, Lockleys (AU); Philip Tracy, Epping (AU) --.

Signed and Sealed this
Twenty-second Day of September, 2015

Michelle K. Lee
*Director of the United States Patent and Trademark Office*